(12) United States Patent
Gogolla et al.

(10) Patent No.: US 9,651,702 B2
(45) Date of Patent: May 16, 2017

(54) OPERATING METHOD AND COIL ARRANGEMENT FOR A MAGNETIC SENSOR FOR DETECTING METALLIC OBJECTS IN A SUBGRADE

(75) Inventors: Torsten Gogolla, Schaan (LI); Christoph Wuersch, Werdenberg (CH); Andreas John, Berschis (CH)

(73) Assignee: Hilti Aktiengesellschaft, Schaan (LI)

( * ) Notice: Subject to any disclaimer, the term of this patent is extended or adjusted under 35 U.S.C. 154(b) by 1178 days.

(21) Appl. No.: 12/714,260

(22) Filed: Feb. 26, 2010

(65) Prior Publication Data
US 2010/0219823 A1 Sep. 2, 2010

(30) Foreign Application Priority Data
Feb. 27, 2009 (DE) .................. 10 2009 010 943

(51) Int. Cl.
*G01R 33/02* (2006.01)
*G01V 3/10* (2006.01)
(Continued)

(52) U.S. Cl.
CPC .................. *G01V 3/10* (2013.01); *H01F 1/00* (2013.01); *H01L 21/00* (2013.01); *H02J 1/00* (2013.01)

(58) Field of Classification Search
CPC ...... H02J 1/00; H01F 1/00; B60L 1/00; H01L 21/00
(Continued)

(56) References Cited

U.S. PATENT DOCUMENTS 4,016,487 A 4/1977 Neumaier
4,855,677 A * 8/1989 Clark et al. .................. 324/238
(Continued)

FOREIGN PATENT DOCUMENTS

DE 1 012 274 7/1957
DE 36 15 652 C2 11/1987
(Continued)

OTHER PUBLICATIONS

German Search Report, dated Nov. 26, 2009, 8 pages.
(Continued)

*Primary Examiner* — Jermele M Hollington
*Assistant Examiner* — Temilade Rhodes-Vivour
(74) *Attorney, Agent, or Firm* — Crowell & Moring LLP

(57) ABSTRACT

A coil arrangement for a magnetic sensor for detecting metallic objects in a subgrade, in particular structures made of concrete, brick, and wood, as well as a method for energizing and reading out this coil arrangement, is disclosed. The coil arrangement includes one or preferably two stacked outer main coils via which a perpendicular magnetomotive force of the subgrade is effected. Provided within the outer main coil(s) is, on the one hand, a quartet of a total of two pairs of parallel coils lying symmetrical to the axis of the main coil(s), via which a magnetomotive force penetration of the subgrade in two directions parallel to the subgrade surface is possible. To further improve the accuracy and reliability of localizing objects and estimating depth of cover, two pairs of smaller orthogonal coils each opposite from one another and also arranged symmetrically to the axis of the main coil(s) are provided.

19 Claims, 8 Drawing Sheets

Case A

Case B

(51) Int. Cl.
    *H02J 1/00*         (2006.01)
    *H01L 21/00*        (2006.01)
    *H01F 1/00*         (2006.01)

(58) Field of Classification Search
    USPC ...... 324/66–67, 326–332, 334, 22, 260–262,
                324/228, 232, 175, 189; 702/188;
                73/152.42, 50; 166/252.2; 342/22, 175,
                342/189; 175/45, 61, 40, 48, 26
    See application file for complete search history.

(56) References Cited

U.S. PATENT DOCUMENTS

| | | | |
|---|---|---|---|
| 4,916,394 A * | 4/1990 | Thompson | 324/262 |
| 5,191,286 A * | 3/1993 | Fischer | 324/230 |
| 5,557,206 A | 9/1996 | Won | |
| 6,040,986 A * | 3/2000 | Sakamoto | H01F 38/14 |
| | | | 363/21.02 |
| 6,232,774 B1 * | 5/2001 | Kimura | 324/235 |
| 6,707,298 B2 * | 3/2004 | Suzuki et al. | 324/252 |
| 6,791,329 B2 * | 9/2004 | Nelson | 324/329 |
| 7,047,059 B2 * | 5/2006 | Avrin et al. | 600/409 |
| 7,345,470 B2 * | 3/2008 | Suzuki | 324/202 |
| 7,443,154 B1 | 10/2008 | Merewether et al. | |
| 7,649,283 B2 * | 1/2010 | Tonn | H02J 5/005 |
| | | | 307/104 |
| 8,229,567 B2 * | 7/2012 | Phillips | A61N 1/3787 |
| | | | 607/60 |
| 2002/0053909 A1 | 5/2002 | Candy | |
| 2003/0052684 A1 | 3/2003 | Nelson et al. | |
| 2004/0232909 A1 * | 11/2004 | Imamoto et al. | 324/228 |
| 2006/0238401 A1 | 10/2006 | Wuersch et al. | |
| 2010/0072991 A1 * | 3/2010 | Gleich | A61B 5/05 |
| | | | 324/228 |
| 2010/0175923 A1 * | 7/2010 | Allan | E21B 47/024 |
| | | | 175/45 |

FOREIGN PATENT DOCUMENTS

| | | |
|---|---|---|
| DE | 37 33 529 A1 | 4/1989 |
| DE | 44 23 661 A1 | 1/1996 |
| DE | 101 22 741 A1 | 11/2002 |
| DE | 601 06 215 T2 | 4/2005 |
| DE | 10 2005 019 239 A1 | 11/2006 |
| DE | 699 35 792 T2 | 8/2007 |
| DE | 699 36 262 T2 | 2/2008 |
| DE | 10 2006 053 222 B4 | 5/2008 |
| EP | 0 249 110 A2 | 12/1987 |
| EP | 0 664 685 A2 | 5/1995 |
| EP | 0 740 822 B1 | 11/1996 |
| EP | 1 092 988 B1 | 4/2001 |
| EP | 1 092 989 B1 | 4/2001 |
| JP | 3-233392 A | 10/1991 |
| WO | WO 00/00848 A1 | 1/2000 |

OTHER PUBLICATIONS

European Search Report issued in European counterpart application No. 10153838.7—1559/2224267 dated Nov. 7, 2016, with Statement of Relevancy (Fourteen (14) pages).

Slawomir Tumanski: "Review Article; Induction coil sensors—a review", Measurement Science and Technology, IOP, Bristol, GB, Bd. 18, Nr. 3, Mar. 1, 2007, pp. R31—R46, XP020118574, 16 total pages.

* cited by examiner

OPERATING METHOD AND COIL ARRANGEMENT FOR A MAGNETIC SENSOR FOR DETECTING METALLIC OBJECTS IN A SUBGRADE

This application claims the priority of German Patent Document No. 10 2009 010 943.9, filed Feb. 27, 2009, the disclosure of which is expressly incorporated by reference herein.

BACKGROUND AND SUMMARY OF THE INVENTION

The invention relates to a magnetic sensor for detecting metallic objects in a subgrade medium, i.e., for localization and/or depth of cover measurement of, for example, electrically conductive objects embedded in walls, floors and ceilings such as concrete reinforcing bars, copper pipe, prestressing cable, double T-beams, plates, grates, etc., in common subgrades of building structures, for example, concrete, brick, wood, plaster, etc.

A plurality of proposals is known within international patent class G01V3/08-12 for detecting objects buried in subgrades, wherein reference is made only as an example to European Patent Document No. EP 1092989 B1, German Patent Document Nos. DE 699 35 792 T2, DE 3615652 C2, DE 101 22 741 A1 and U.S. Pat. No. 5,557,206.

To detect objects in the sense outlined above, in principle a strong magnetic primary field is induced with a coil in the subgrade, which interacts with any metallic objects that are possibly located there. FIG. 1 of the drawings illustrates a general case, in which a primary or excitation coil 1 generates a strong periodic magnetic field 3, which, in the case of an object-free subgrade, does not generate a field asymmetry (Case A) in one or more of the receiving coils 2 that are situated symmetrically to the axis of the magnetic field 3 (Case A), while, in the case of the presence of a (ferrous) object 4, a registerable field change is detectable via the receiving coil 2 (Case B). This interaction is expressed, on the one hand, in that, in the case of permeable objects 4, particularly those made of iron, the magnetic flux lines are diverted in the direction of the iron due to flux guidance effects, because they follow the path of the least magnetic resistance. The field asymmetry that arises because of this can be measured differentially. If, for example, as depicted in Case B of FIG. 1, an iron object 4 is located in the subgrade, then the angle of the flux lines changes there and therefore the induced voltage measured by the right receiving coil. Therefore, an induced voltage difference unequal to zero originates between the left and right of the two receiving coils 2. This difference is a measure of the position and depth of the object 4.

On the other hand, a strong, rapidly decaying primary field 3 (see FIG. 2) generates eddy currents 5 in metallic objects 4, which generate a delayed, relatively weak and slowly decaying secondary field 6. The decaying eddy current magnetic field 6 can be measured by coils, in particular also via the excitation coil 1 that simultaneously serves as a receiving coil, and contains information about the position and depth of the object 4. In the case of pulse-shaped excitation, the eddy current response can be detected directly because the primary field 3 decays very rapidly (in a few microseconds), while the secondary eddy current field 6 decays considerably slower as a function of the depth of the object 4, the object size and the material properties of the object 4. Measuring the eddy current response is thus carried out after the primary field 3 decays. In the case of harmonic excitation, the secondary eddy current magnetic field 6 influences the primary field 3 so that field asymmetries again arise that causes the induced voltage changes as described above.

The induced voltage change may be measured both monostatically as well as bistatically. In the case of a monostatic measurement, the same coil is used to both excite as well as measure. In the case of a bistatic measurement, the excitation coil(s) and the receiving coils(s) are different (see only as an example DE 69935792T2, EP 1092989 B1, and DE 101 22 741 A1). The detection of objects embedded in building structure subgrades is carried out in the case of the hand-operated sensors described here by scanning or sweeping the suspected location of the embedded object multiple times. In this connection, scanning yields considerably more reliable localization results than with selective placement of the sensor.

Measuring instruments that are currently known for detecting metallic objects in a subgrade have comparatively simple coil arrangements having only a few coils. The possibilities for magnetomotive force in a subgrade are limited in this case with respect to the direction and shape of the magnetic field and therefore also the possibilities for detecting objects as well as for determining depth and position. Particularly measurement above welded grates, as it is used above all in concrete subgrades, causes problems because, in the case of a magnetomotive force from above (see FIG. 1), eddy currents are excited in at least an entire mesh, which can dominate as compared with the eddy currents generated within the individual lattice bars themselves such that localizing and securely detecting them is unreliable or impossible. In addition, permeable subgrades, such as, for example, brick containing iron oxide or concrete containing magnetite, also influence the magnetic flux guidance and therefore also the measurable induced voltage. Reliable localization and depth of cover measurement are generally impossible in such cases.

The object of the invention is therefore making available a coil arrangement and an operating method for detecting metallic objects in subgrades, which allow a localizing and/or depth of cover measurement of objects buried in the subgrade to be achieved considerably more precisely and reliably than was previously possible.

The invention started from the knowledge gained initially on the basis of experience with known measuring instruments that a good separation property with simultaneously high measuring depth is not possible with only one type of magnetomotive force, because coils with great measuring depth have poor separation properties. A separation of objects that are lying densely together at an average depth of between approx. 50 mm to approx. 80 mm is typically not realizable as a result. Narrow oval coil shapes such as those mentioned in DE 69935792 T2, particularly those with a high ellipticity, would indeed meet both requirements, but not the simultaneous requirement for rotational or orientational independency of the sensor, i.e., independence of the measuring results from the orientation of the coil arrangement related to the orientation of the embedded objects or related to the movement direction of the sensor. Even the reliability of the object localization and the depth of cover measurement with an improper orientation of the sensor are strongly restricted.

The invention provides a coil arrangement for magnetic sensors for detecting metallic objects in subgrades as well as discloses a measuring method that eliminates the aforementioned restrictions, such as they have been observed in the previously known measuring instruments of the type under discussion here. In particular, optimally adapted types of magnetomotive force, but also reception characteristics, are made possible for different measuring tasks, e.g., those that are sequential.

According to one embodiment, a magnetic sensor for detecting metallic objects in a subgrade medium includes a coil arrangement with a main coil, whose winding plane or winding surface or planes is (are) aligned essentially parallel to a movement surface of the sensor, wherein the subgrade medium experiences magnetomotive force perpendicular to the movement surface of the sensor. In this case, the movement surface is a sensor surface that, with proper use, is oriented essentially parallel to the subgrade medium and that is normally flat.

The plane on which the coil windings are projected perpendicularly are designated as the winding plane in the following. The winding surface designates the area in the winding plane surrounded by the projected windings. In the case of a cylindrical coil, the winding surface is its base area, i.e., the area which is bordered by the lowermost winding layer. The two-sided vertical projection of the winding surface defines an expanded winding cylinder, whose length is not limited to the length of the coil body and whose upper and lower base areas are defined parallel to the winding surface. The length of the winding cylinder may exceed the coil body toward the top and/or toward the bottom, for instance, symmetrically to a plane of symmetry of the coil body that is parallel to the winding plane. According to a group of embodiments, the winding cylinder can terminate with the upper edge and/or the lower edge of the coil body or of the winding body.

At least two coils of a first coil group are provided in the interior of the expanded winding cylinder of the first main coil, whose winding planes can be inclined at an angle of between −90° to +90° to the winding plane of the first main coil. According to one embodiment, the winding planes of the coils of the first coil group are aligned parallel to the winding plane of the first main coil. According to a further group of embodiments, the coils of the first coil group are located completely or predominately in the interior of the coil body of the first main coil. Independent of the actual angle between the winding planes of the first main coil and the coils of the first coil group, the coils of the first coil group are also designated in short as "parallel coils" in the following. The first coil group may include several coils, for example, an even number, such as two, four, six or more coils, which are respectively arranged in pairs opposite from one another on a main axis of the expanded winding cylinder of the first main coil. It is preferred that at least the coils of each individual coil pair be spaced apart equally from the main axis of the expanded winding cylinder of the first main coil. According to another embodiment, all coils of the first coil group have the same distance from the main axis.

Moreover, the coil arrangement includes at least two additional coils of a second coil group arranged in the interior of the expanded winding cylinder of the first main coil, whose winding planes occupy other angles with respect to the winding plane of the first main coil than the winding planes of the coils of the first coil group. According to one embodiment, the winding planes of the coils of the second and those of the first coil group are situated orthogonally to one another. According to another embodiment, the winding planes of the second coil group are situated orthogonally to the winding plane of the first main coil. According to a further group of embodiments, the coils of the second coil group are located completely or predominantly in the interior of the coil body of the first main coil. Independent of the actual angle between the winding planes of the coils of the first and second coil groups or between the winding planes of the coils of the second coil group and the main coil, the coils of the second coil group are also designated in short as "orthogonal coils" in the following. Similar to the first coil group, the second coil group may also include an even number of coils, for example two, four, six or more coils, which are respectively arranged in pairs opposite from one another on a main axis of the main coil. It is preferred that the coils of each individual coil pair be spaced apart equally from the main axis of the main coil. According to a further exemplary embodiment, all coils of the second coil group have the same distance from the main axis.

The coils of the first and second coil group may be smaller than the first main coil insofar as their winding surfaces may be smaller than the winding surface of the first main coil.

According to one embodiment, the main coil is designed as a rotationally symmetrical coil, for example as a rotationally symmetrical flat coil, wherein the main axis coincides with the axis of symmetry of the rotationally symmetrical coil.

To improve the sensor properties with respect to object localization, depth of cover measurement, detection of ferritic subgrades as well as grate structures, e.g., of welded grates, and determination of the orientation of embedded objects, it is advantageous, if respectively two of the at least two coils of the first coil group (parallel coils) are arranged opposite from one another and connected electrically with one another in such a way that their excitation currents run in the opposite direction of each other so that their magnetic fields flow through an object embedded in the subgrade between the two coils essentially horizontally and in the same direction. For example, the first coil group includes four coils (parallel coils) with the same winding plane at an angular distance of respectively 90° and equally spaced apart from the main axis of the main coil. To widen the horizontal magnetomotive force emanating from the smaller parallel coils, it can be advantageous to wind the coils of the first coil group ovally or elliptically, wherein the auxiliary axes of the coils are respectively aligned the same, opposing in pairs. The coils of the first coil group have, for example, respectively essentially the same winding surface and/or the same inductivity.

The second coil group includes for example four coils (orthogonal coils) of the same size and induction, whose winding surfaces are respectively aligned perpendicular to one another and parallel to the main axis of the sensor and thus parallel to the main axis of the main coil.

The coils of the second coil group may be arranged between the main axis and the coils of the first coil group. For example, four orthogonal coils may be arranged spaced apart close to one another inside the parallel coils, at the same distance and symmetrically to the axis of the main coil.

A particular advantage in terms of better detection, particularly of deeper lying objects, is produced if the coil arrangement includes a second main coil with a winding plane parallel to the first main coil, which is arranged relative to the movement surface of the sensor below, but preferably above the first main coil. The second main coil is, for example, a rotationally symmetrical coil, for instance a rotationally symmetrical flat coil, whose diameter is somewhat smaller or larger than the diameter of the (first) main coil so that distinctly different signal signatures are produced, which enable a better depth of cover estimation. For example, the diameter of the first main coil lies between approx. 50 mm and approx. 150 mm, preferably between approx. 80 mm and approx. 100 mm. The diameter of the second main coil is for example approx. 10 mm smaller or larger than the diameter of the first main coil.

For sensors of the type under discussion here that are larger in terms of surface, it can be advantageous for a further increase in resolution in the detection of objects in subgrades to provide an in-line arrangement of several of the coil arrangements described above. In particular, the coil arrangement includes an in-line arrangement of several, respectively equally grouped parallel coils and/or orthogonal coils, wherein this in-line arrangement is surrounded by one or two common main coil(s).

Further details of a coil arrangement and for operating a coil arrangement with the characteristics according to the invention are explained in the following on the basis of exemplary embodiments.

DETAILED DESCRIPTION OF THE DRAWINGS

Figure 1:
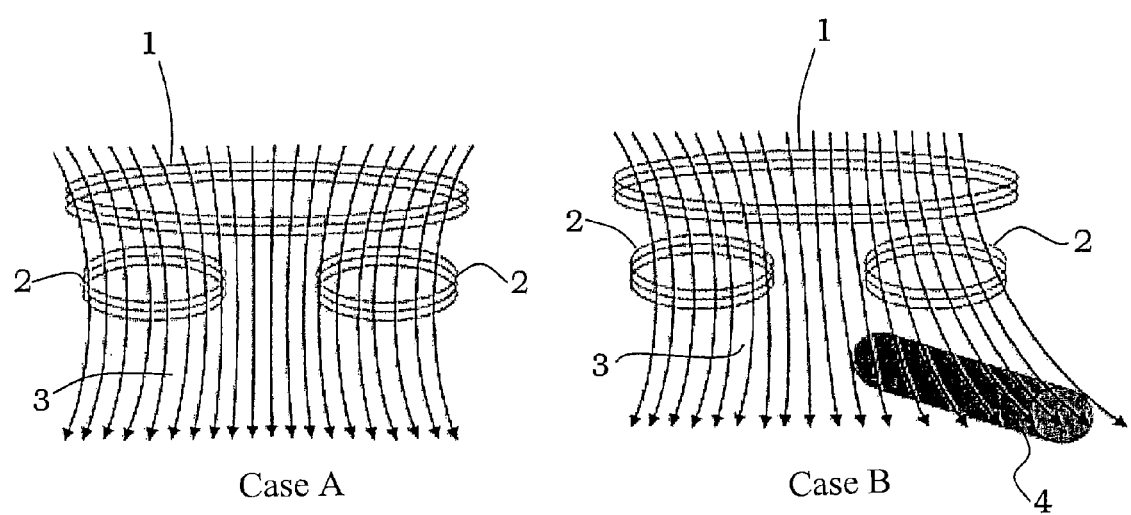
FIG. 1 illustrates, on the basis of an already explained schematic diagram, the interaction of a magnetic field generated in a subgrade by an excitation coil with a permeable object made of, for example, iron embedded in the subgrade.
Figure 2:
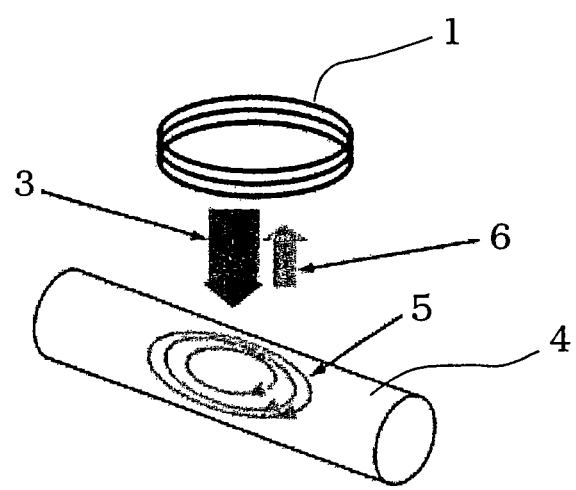
FIG. 2 illustrates, on the basis of an already explained schematic diagram, the generation of a secondary magnetic field originating through eddy currents in a permeable object embedded in the subgrade, from whose properties the position and depth of the object can be derived.
Figure 3A:
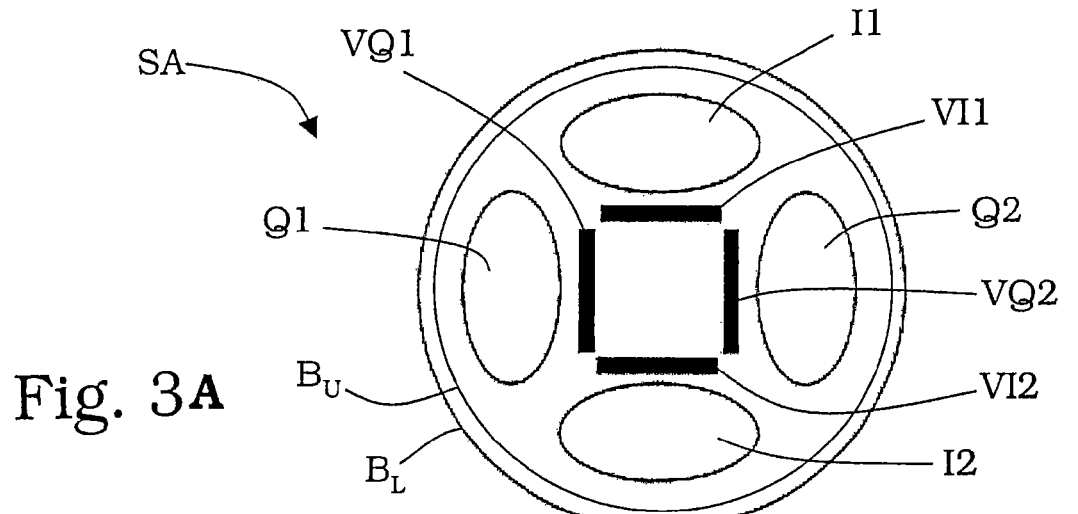
FIG. 3A is a schematic top view of a coil arrangement according to an embodiment of the invention.
Figure 3B:
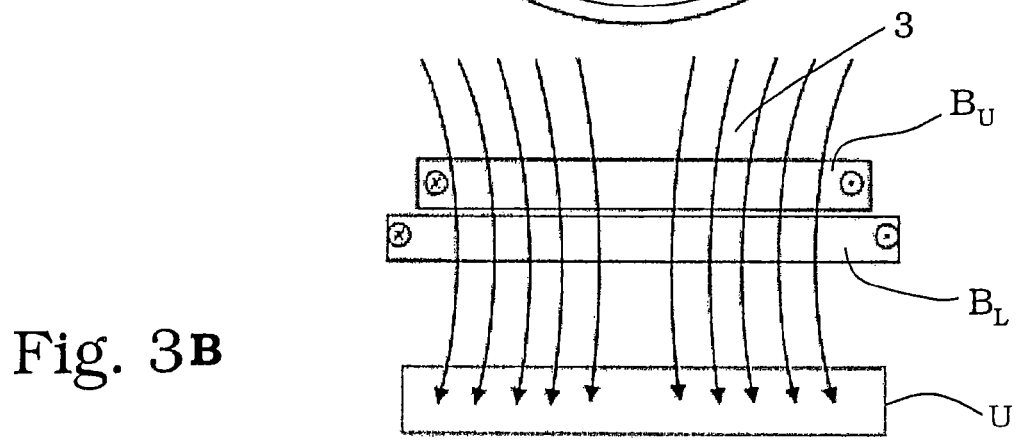
FIG. 3B is a simplified schematic cross-sectional view of the two main coils of the embodiment according to FIG. 3A.
Figure 3C:
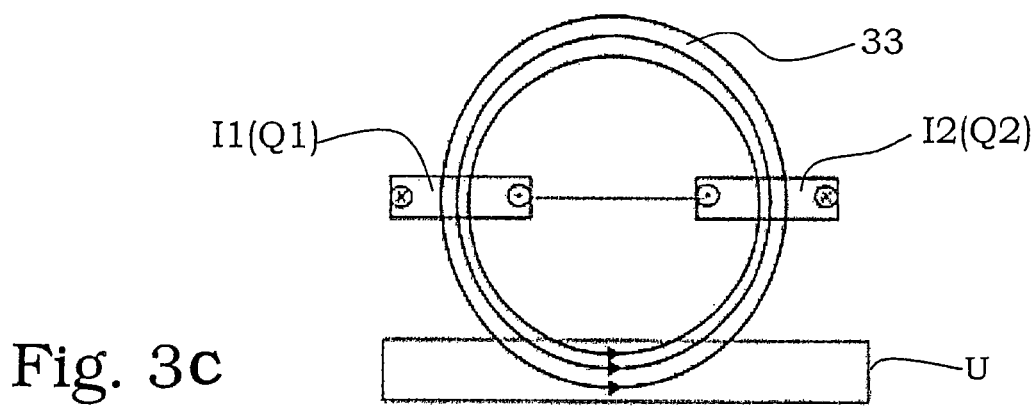
FIG. 3C is a simplified schematic cross-sectional view of two coils of a first coil group of the embodiment according to FIG. 3A.

The coil arrangement SA depicted in FIG. 3A to FIG. 3C includes a first main coil $B_L$, which flows through a to-be-investigated subgrade and measuring objects embedded therein from above and in the perpendicular direction to the surface of the subgrade (see FIG. 3B), four coils I1, I2, Q1, Q2 of a first coil group (parallel coils) and four coils VI1, VI2, VQ1, VQ2 of a second coil group (orthogonal coils).

The first coil group includes two coil pairs I1, I2 or Q1, Q2, arranged orthogonally to one another, which are arranged in the expanded winding cylinder of the first main coil $B_L$, for instance completely or predominantly in the interior of the first main coil $B_L$. The coils I1, I2, Q1, Q2 of the first coil group are arranged with the same winding plane, at an angular distance of respectively 90° and equally spaced apart from the axis of the main coil $B_L$.

As the simplified depiction in FIG. 3B shows, an exciting field 3 generated by the main coil $B_L$ flows through a to-be-investigated subgrade U and measuring objects embedded therein from above and in the perpendicular direction to the surface of the subgrade. The diameter of the first main coil $B_L$, which may be embodied to be relatively large and flat, is approx. 90 mm for example. A number of windings of approx. 130 and a coil thickness of 8 mm produces an inductivity of 3 mH. Based on its size, the first main coil $B_L$ is suitable for detecting deep objects (e.g., depth>120 mm). However, under some circumstances, the first main coil $B_L$ does not adequately resolve objects close to the surface and only permits relatively poor separation to be achieved with objects close to the surface in particular. The first main coil $B_L$ is operated preferably monostatically, i.e., it operates both as an excitation coil as well as a receiving coil.

According to FIG. 3C, the two coil pairs I1, I2 or Q1, Q2 arranged orthogonally to one another in the interior of the first main coil $B_L$ are connected to one another for example so that their excitation currents run in the opposite direction of each other, which results in a magnetomotive force 33 of the subgrade U that is essentially parallel to the measuring surface SO between the coils of the respective coil pairs I1, I2 or Q1, Q2. The magnetomotive force 33 through the parallel coils does not therefore occur from above, but, relative to the sensor measuring objects, laterally and namely in two orthogonal directions that are different from one another, which are associated, on the one hand, with the coil pair I1, I2 and, on the other hand, with the coil pair Q1, Q2. The coils I1, I2, Q1, Q2 of the first coil group are operated both monostatically as well as bistatically.

In monostatic operation, the coils of the first coil group make distinctly better separation properties possible up to a certain measuring depth (e.g., up to approx. 80 mm) when localizing embedded objects, or resolving adjacent objects. This coil arrangement can localize bars of welded grates in particular, because in this case the grate is essentially flowed through from the side so that eddy currents are generated in the mesh of the grate only to a small degree. Because of the different magnetomotive force directions, the combination of the coils $B_L$, I1, I2 and Q1, Q2 makes measuring and analysis methods possible that are good at detecting welded grates as well as permeable subgrade materials. For example, the detection of permeable subgrade materials in the presence of metallic objects initiates a calibration measurement and therefore a resetting of the measuring signals. If, based on a typical signal signature, a grate is detected, localization of the lattice bars can be carried out exclusively with the monostatically operated coil pairs I1, I2 and Q1, Q2 of the first coil group, because its type of magnetomotive force does not induce any or only low eddy currents in the mesh. The different magnetomotive force directions that this coil arrangement makes possible allows welded grates and permeable subgrades to be detected, lattice bars to be localized and very precise results to be achieved for the depth of cover measurement.

In a first bistatic operation, the main coil $B_L$ is acted upon (energized) with an excitation current while the current induced in the coils I1, I2, Q1, Q2 of the first coil group (parallel coils) is measured (read out). The measuring depth in this case is considerably greater than with monostatic operation so that, in addition to the information about the main coil $B_L$, additional information is available during the detection of deep objects (depth>80 mm).

A second bistatic operation, in which a coil pair is respectively energized and the other is read out ("energize coils I1, I2 and read out coils Q1, Q2" or "energize coils Q1, Q2 and read out coils I1, I2") supplies information about the orientation of the embedded objects as related to the orientation of the coil arrangement or of the sensor.

In the case of the coil arrangement described here, the separation properties are still a function of the orientation of the embedded measuring objects. If measuring objects are oriented in the direction of the coil pair I1, I2 or the coil pair Q1, Q2, then the separation and localizing properties are ideal, whereas with an orientation of 45°, more or less just the same result will be reached as with the use of the main coil $B_L$ alone. In order to achieve an optimum measuring accuracy, the preferred direction of an object also has to be detected, which in difficult cases, e.g., with intersecting objects, is not yet possible in a reliable manner with the previously described coil arrangement.

A clear improvement of the separation properties is achieved with the coils (orthogonal coils) of the second coil group, which may also be arranged for instance completely or predominantly in the interior of the first main coil $B_L$ in the expanded winding cylinder of the first main coil $B_L$. The second coil group includes at least one coil pair whose winding planes are inclined at different angle to the winding plane of the first main coil $B_L$ and the winding plane of the coils of the first coil group.

As FIG. 3A shows, the winding planes of the coils VI1, VI2, VQ1, VQ2 of the second coil group are perpendicular to the winding planes of the coils I1, I2, Q1, Q2 of the first coil group and therefore, in this case, also perpendicular to the winding plane of the first main coil $B_L$, wherein the coils of a coil pair are preferably arranged respectively opposing on the main axis of the main coil $B_L$. The coils of the second coil group (orthogonal coils) may be operated bistatically, wherein the first main coil $B_L$ is the excitation coil. Due to the small mutual distance of the coils, their orthogonal, symmetrical orientation and the combinability of the measuring signals tapped by the coils, a coil arrangement with the first main coil $B_L$ of a first coil group having four coils I1, I2, Q1, Q2 (parallel coils) and a second coil group having four coils VI1, VI2, VQ1, VQ2 (orthogonal coils) arranged closely spaced apart around the vertical axis supplies good separation properties independent of the orientation of embedded metallic objects and therefore reliable localizing thereof up to a certain measuring depth, which is less than the measuring depth that would generally be achievable with the first main coil $B_L$, e.g., to a measuring depth less than approx. 120 mm.

According to FIG. 3A, the sensor arrangement may therefore also have a second main coil $B_U$, which may be designed, for example, rotationally symmetrically, and for example, as a rotationally symmetrical flat coil. The diameter of the second main coil $B_U$, which in this exemplary embodiment in FIG. 3B is arranged related to the movement surface of the sensor above the first main coil $B_L$, can be negligibly smaller or larger than that of the first main coil $B_L$. The accuracy of a depth of cover measurement is further increased with the second coil plane, in particular in the detection of objects embedded comparatively deep in the subgrade (e.g., depth>120 mm).

Figure 4:
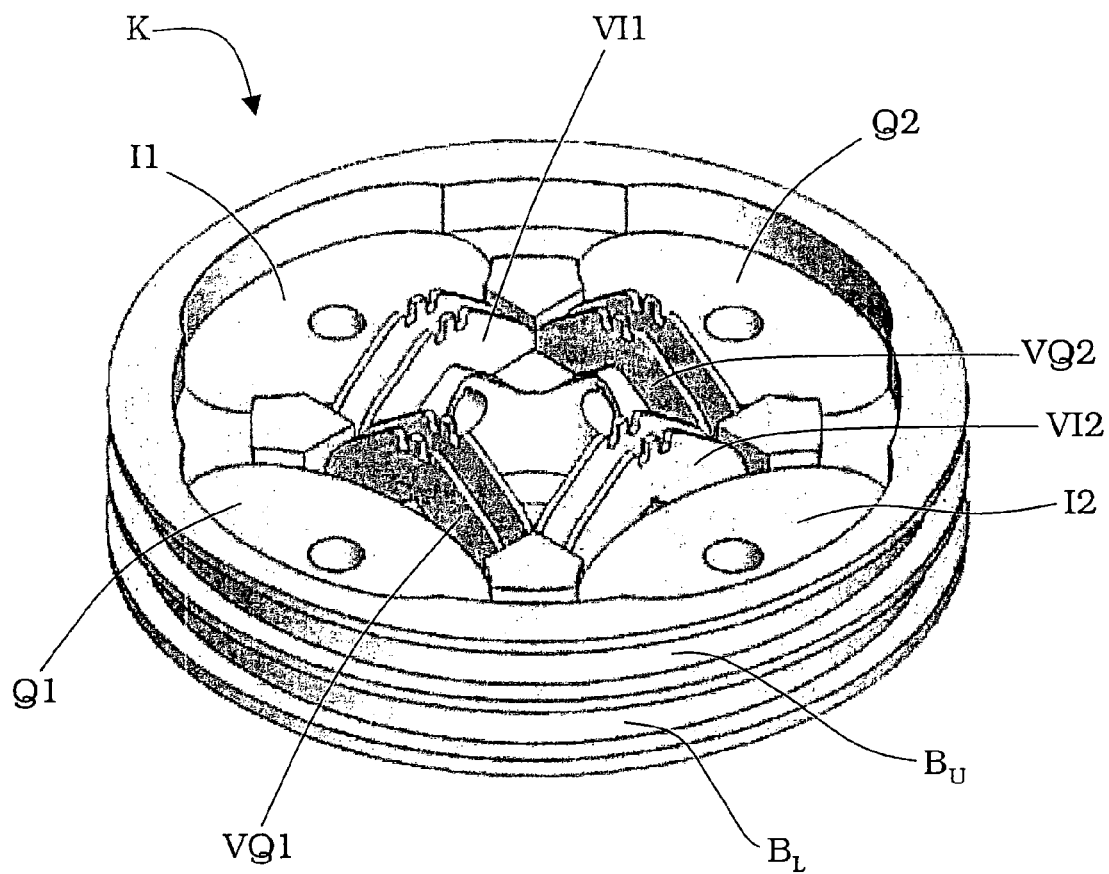
FIG. 4 is a perspective representation of a head of a sensor or coil body for a coil arrangement according to FIG. 3A in accordance with a further embodiment of the invention.

FIG. 4 shows a perspective representation of a coil body K for a first and second main coil $B_L$, $B_U$ of a coil arrangement according to FIG. 3A. The single or multi-part coil body K is also designed to accommodate four coils I1, I2, Q1, Q2 of a first coil group aligned parallel to the main coils $B_L$, $B_U$ and four coils VI1, VI2, VQ1, VQ2 of a second coil group aligned orthogonally to the main coils.

To further improve the separation properties as well as the detection of the orientation of measuring objects in subgrades, the coil arrangement according to FIG. 3A can be duplicated in whole or in part. Exemplary embodiments thereof are the arrangements depicted in FIGS. 5 through 7.

Figure 5:
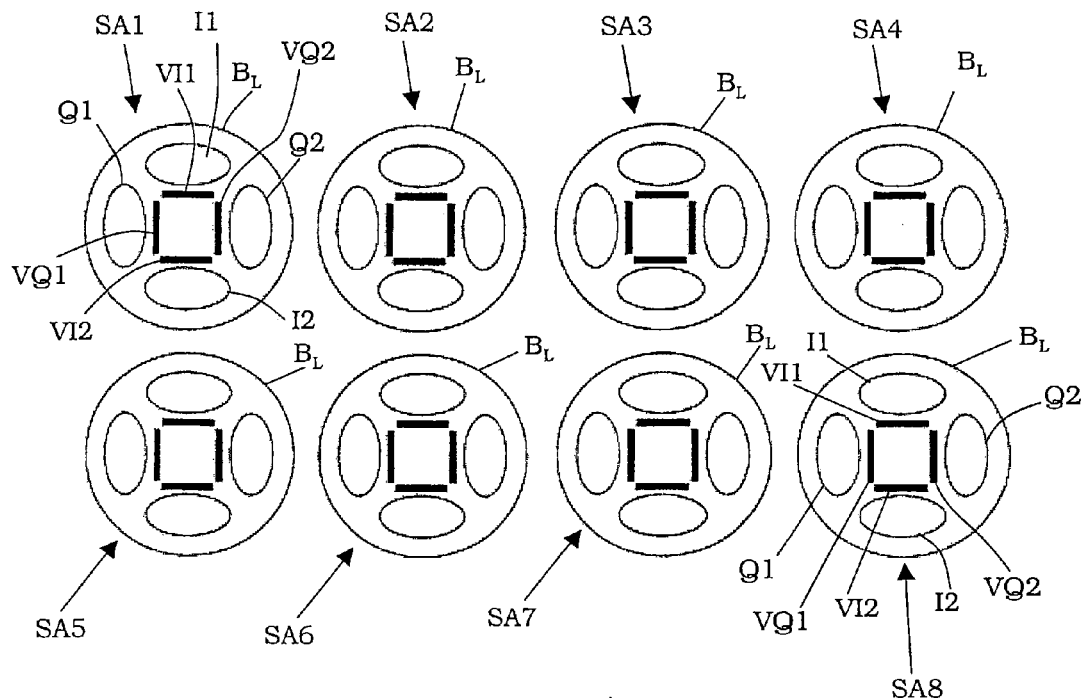
FIG. 5 is a schematic top view of a coil arrangement having an in-line arrangement in pairs of respectively four coil arrangements according to FIG. 3A in accordance with a further embodiment of the invention.

In the case of the arrangement according to FIG. 5, eight coil arrangements SA1-SA8 are arranged next to one another in two parallel rows. Every coil arrangement SA1-SA8 includes at least one main coil $B_L$, four coils I1, I2, Q1, Q2 of a first coil group and four coils of a second coil group VI1, VI2, VQ1, VQ2 according to FIG. 3A. Instead of eight, the arrangement may include two, four, six or more than eight coil arrangements according to FIG. 3A. All coil arrangements SA1-SA8 may also respectively have a second main coil $B_U$ according to FIG. 3A.

Figure 6:
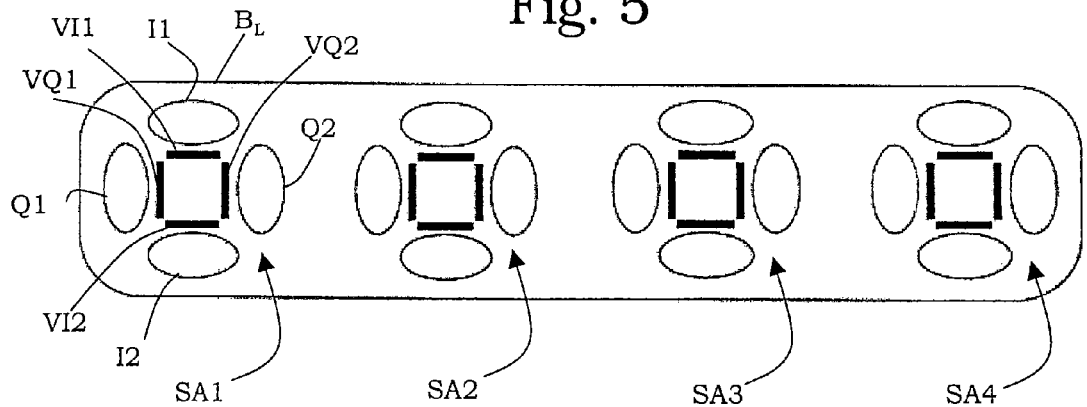
FIG. 6 is a schematic top view of an arrangement with an oblong main coil and four groups of respectively four parallel and orthogonal coils arranged in the interior of the main coil in a row in accordance with a further embodiment of the invention.

The arrangement according to FIG. 6 includes four groups SA1 to SA4 of the same type, each having four coils I1, I2, Q1, Q2 of a first coil group and four coils of a second coil group VI1, VI2, VQ1, VQ2 according to FIG. 3A. The four groups SA1 to SA4 are arranged in a row, which are surrounded by a first main coil $B_L$. According to other embodiments, the row is also surrounded by a second main coil, which is somewhat smaller or larger than the first main coil.

Figure 7:
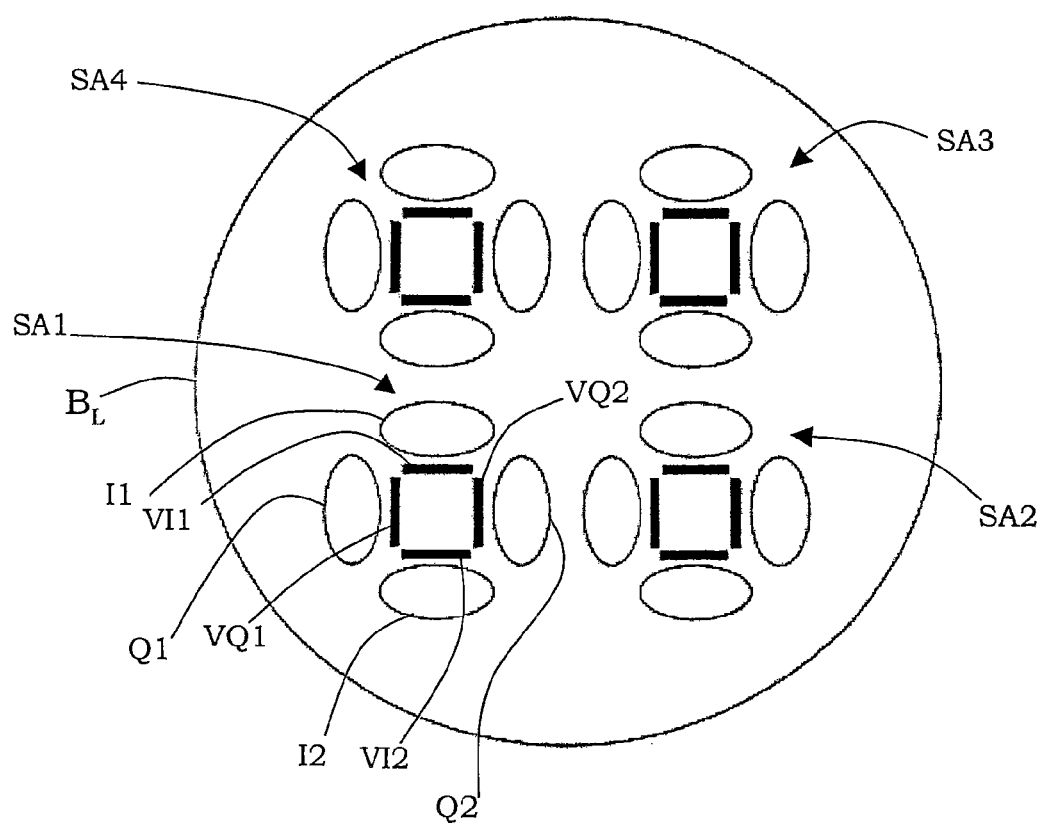
FIG. 7 is a schematic top view of an arrangement with a circular main coil and four groups of respectively four parallel and orthogonal coils arranged in the interior of the main coil in accordance with a further embodiment of the invention.

In the case of the embodiment according to FIG. 7, a quartet of groups of respectively four coils I1, I2, Q1, Q2 of a first coil group and four coils of a second coil group VI1, VI2, VQ1, VQ2 according to FIG. 3A is also surrounded by a first main coil $B_L$.

The preferred operation and resulting advantages of the invention will be described in the following.

Belonging to the coil arrangement according to the invention is at least one main coil $B_L$ that is horizontal during a measuring procedure, whose magnetic field flows through embedded measuring objects from above (perpendicularly), thereby allowing a great measuring depth to be achieved. This main coil $B_L$ is operated both monostatically as well as bistatically in connection with further coils in order to obtain additional information for a precise depth of cover measurement about a narrow localization area. The main coil $B_L$ is designed to be rotationally symmetrical (biaxial symmetry) and therefore independent of orientation.

In an advantageous embodiment, the coil arrangement includes four additional smaller coil pairs I1, I2 or Q1, Q2 aligned perpendicular to one another and opposite from one another, and parallel to the winding plane of the main coil, which are interconnected in pairs so that their magnetic fields flow through the measuring objects laterally from different directions. As a result, good separation properties and a reliable measurement can be achieved of welded metal grates in particular.

The pairs of the smaller horizontal coils are thus oriented orthogonally to one another and are operated monostatically in a preferred measuring procedure so that along with the main coil $B_L$, three orthogonal magnetomotive force directions are possible. The measuring accuracy of the depth of cover measurement and the separation property is distinctly improved thereby guaranteeing the reliable detection of welded grates, conductive non-ferrous objects and ferritic subgrades. When detecting ferritic subgrades, it is advantageous to start first with a calibration measurement in order to eliminate the effect thereof.

The parallel coils are advantageously designed to be oval, thereby enlarging the received signal with the better surface utilization. The dependence of a composite signal (I+Q) generated from the coil pairs I1, I2 or Q1, Q2 of the first coil group on the angle from the embedded objects or on the orientation of the embedded object is reduced.

Further information for improving the reliability in a localization and depth of cover measurement can be achieved if the coil pairs I1, I2 or Q1, Q2 are operated bistatically, wherein the outer coil $B_L$ is energized and read out via the coil pairs I1, I2 and/or Q1, Q2.

An improved conclusion about the angle orientation of measuring objects related to the orientation of the sensor head can be achieved in a measuring run if the horizontal coil pairs I1, I2 or Q1, Q2 are operated bistatically, according to the alternatives "energize I1, I2 and read out Q1, Q2" or "energize Q1, Q2 and read out I1, I2." In order to save measuring time, it may also be provided that the two horizontal coil pairs I1, I2 or Q1, Q2 be energized simultaneously. Because of the orthogonality, energizing a parallel coil pair barely influences the parallel coil pair so that sequential energizing and simultaneous energizing imply the same effects.

In order to particularly increase localization, for instance with a 45° orientation of the measuring objects related to the sensor head, to narrow the localization area and to increase measuring accuracy through additional information, one coil arrangement according to the invention includes a further set of coils arranged vertically close to one another, advantageously in a symmetrical arrangement of four orthogonal coils that are perpendicular to one another. The signals from these orthogonal coils are combined in a specific way for the orientation measurement.

In order to guarantee adequate measuring depth and independence from the orientation, it is advantageous to bistatically operate the vertically arranged coils according to "energize $B_L$ and read out VI1, VI2 or VQ1, VQ2."

Figure 8:
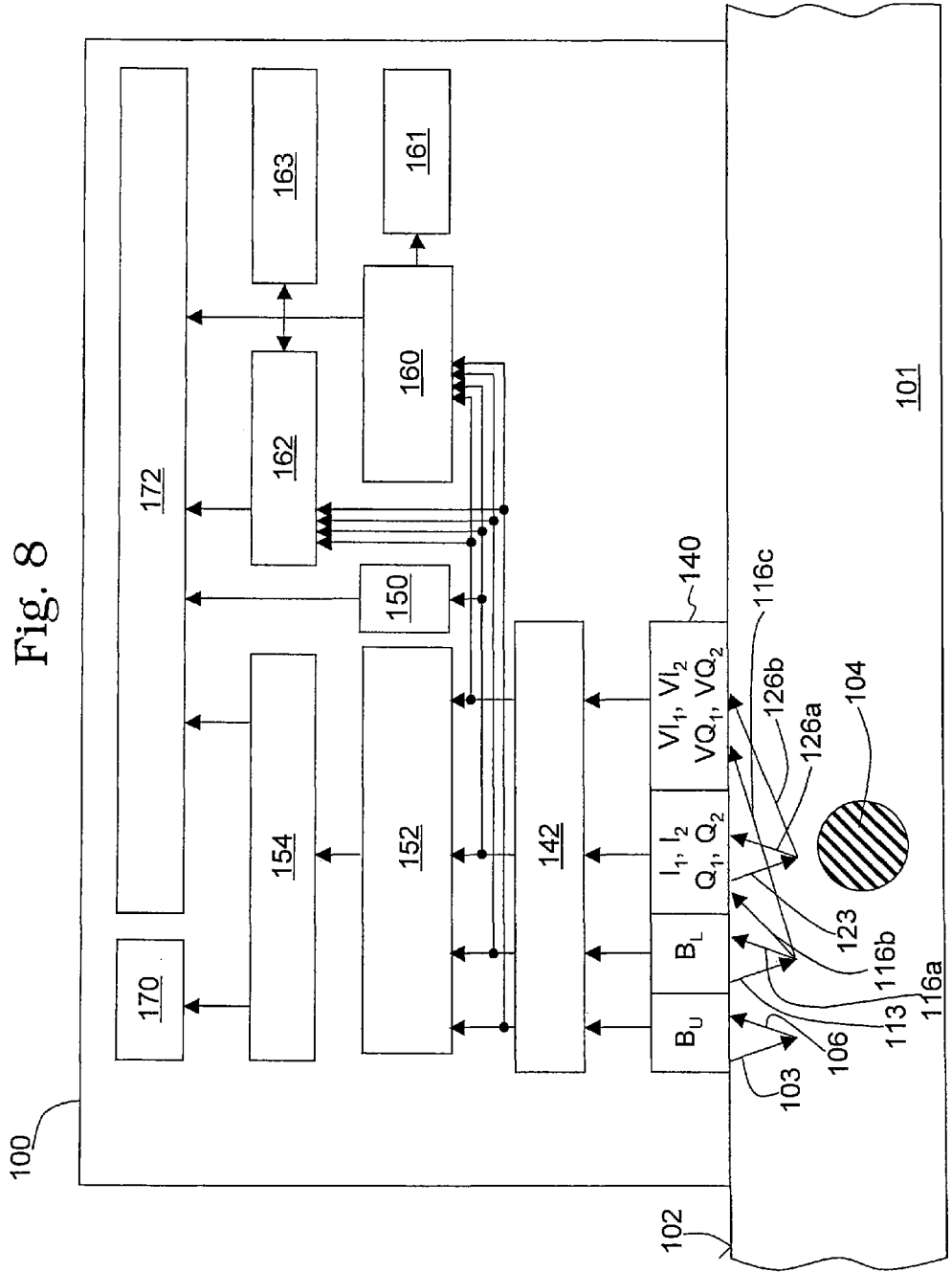
FIG. 8 is a schematic block diagram of a sensor with two pairs of parallel coils arranged in the same plane in accordance with a further embodiment of the invention.

The measurement and analysis method is described in greater detail on the basis of the flow chart in FIG. 8 and the overview of measurement and coil operating modes in Table 1. The movement surface of a sensor 100 rests on a surface 102 of a subgrade 101, in which a permeable object 104 is embedded. The sensor 100 features a coil arrangement 140, which includes a first and a second main coil $B_L$, $B_U$, four coils I1, I2, Q1, Q2 (parallel coils) of a first coil group and four coils VI1, VI2, VQ1, VQ2 (orthogonal coils) of a second coil group. The second main coil $B_U$ is operated monostatically, i.e., excitation 103 and reception 106 are performed by the same coil. This coil is used only for the depth of cover measurement. The first main coil $B_L$ operates both monostatically (excitation 113, reception 116a) as well as bistatically, wherein bistatic operation is characterized by energizing $B_L$ (excitation 113) and reading out the orthogonal coils VI1, VI2, VQ1, VQ2 (reception 116c) or the parallel coil pairs I1, I2 and Q1, Q2 (reception 116b). The parallel coil pairs I1, I2 and Q1, Q2 are also operated monostatically (excitation 123, reception 126a), because, in this case, as described above, the parallel magnetomotive force directions are of significance for detecting welded grates and permeable subgrades as well as for localizing lattice bars.

The signals of the coil arrangement 140 are guided to a signal conditioner 142. Here the respective signals are boosted, filtered, integrated in intervals and offset with calibration signals, wherein an analog processing and/or a digital processing is used by means of a microprocessor. The processed signals then arrive at a decision maker 152, which selects the optimum algorithm for localization based on the signal signatures. A determination is made for the grate mode for welded grates on the basis of the signals from first main coil $B_L$ along with the monostatic signals from the parallel coil pairs I1, I2 and Q1, Q2. The depth mode for very deep objects (>120 mm) and the precision mode for very precise localization at comparatively low depths (<120 mm) are specified on the basis of the signals from the first main coil $B_L$ in connection with the bistatic signals from the orthogonal coils VI1, VI2, VQ1, VQ2.

The localizer 154 detects the position of embedded metallic objects and displays it optically, for example by switching on a LED 170, which for example, can be red, or on a display 172. In grate mode, localizing is carried out with the monostatic signals of the parallel coil pairs I1, I2 and Q1, Q2, because, as mentioned, they feature the optimally adapted magnetomotive force directions. In depth mode, the objects are localized with the aid of the monostatic signal from the first main coil $B_L$ and the bistatic received signals of the parallel coil pairs I1, I2 and Q1, Q2 (energizing of $B_L$), because these signals are suited for great depths (>120 mm). In precision mode, localizing is carried out with the bistatic, advantageously combined received signals of the orthogonal coils VI1, VI2, VQ1, VQ2 (energizing of $B_L$), because they make reliable localization possible that is independent of orientation and has good separation properties because of their arrangement and their small distance. To further improve the separation properties at low depths (<80 mm), the monostatic signals of the parallel coil pairs I1, I2 and Q1, Q2 are also analyzed.

The latter are also provided to an angle estimator 150, which uses these signals to determine the orientation of the embedded objects 104 and display it on the display 172. In addition, the output signals of the signal conditioners 142 are conveyed to the depth of cover estimator 162, which determines the depth of the objects 104 with the aid of a knowledge base 163. To this end, all possible signal combinations are used, which results in high redundancy and thus high reliability. The signals of the first and second main coils $B_L$, $B_U$ are offset ratiometrically, i.e., they are expressed as a ratio so that interference that has a similar effect on both planes is reduced. This ratio is required in particular for accurate depth of cover estimation in the case of very deep objects (>120 mm) if the other components of the coil arrangement 140 are no longer supplying any usable signals. The object depth is depicted on the display 172. In addition, the output signals of the signal conditioners 142 are conveyed to the classifier 160. In this case, a differentiation is made between ferrous, non-ferrous and permeable subgrades with the monostatic signals of the parallel coil pairs I1, I2 and Q1, Q2 and the monostatic signal of the coil $B_L$ using a classification algorithm. The material detection is indicated on the display 172. In the case of the detection of permeable subgrades, a calibration measurement is initiated by a calibration unit 161, which carries out a resetting of the measuring signals. A calibration measurement is also performed if the classifier does not perceive any metallic objects in the vicinity of the sensor. Depending upon the coil arrangement, the energizing times are in a range of 0.3 ms to 0.5 ms. Accordingly, the eddy current response of the embedded metallic object is received in a time window of approx. 1 ms.

The following sequences are carried out for localizing and classification. To begin with, the first main coil $B_L$ is energized and read out together with the parallel coils and orthogonal coils. Then the parallel coils are energized and read out.

To precisely estimate depth of cover, a sequence may also be used during the course of which the second main coil $B_U$ is energized and read out. Naturally, it is also conceivable, instead of the first main coil $B_L$, to energize the second main coil $B_U$, and read out the parallel coils and orthogonal coils. However, this has performance issues regarding the measuring depth as comparison to the preferred variation described above (energizing of $B_L$).

The additional information for localization and depth of cover measurement of objects becomes more reliable if, according to another embodiment of the invention, the parallel coil pairs I1, I2 and/or Q1, Q2 are energized and the orthogonal coils VI1, VI2, VQ1, VQ2 are read out. This operation is indicated in FIG. 8 by the second arrow pointing to the orthogonal coil section. This measurement supplies a further signal signature, which the depth of cover estimator 162 can use in connection with a further knowledge base 163. Because this signal signature differs greatly from the others, the redundancy and therefore the reliability of the depth of cover estimate is increased considerably. Very different signal signatures are "energize $B_L$ and read out $B_L$," "energize parallel coils and read out parallel coils," "energize $B_L$ and read out orthogonal coils" and "energize parallel coils and read out orthogonal coils." Other combinations do not provide substantial improvements in the depth of cover estimate.

As a result, the following three sequences are preferred to precisely estimate depth of cover: To begin with, the first main coil $B_L$ is energized and read out together with the orthogonal coils. Then the parallel coils are energized and read out together with the orthogonal coils. Finally, the second main coil $B_U$ is energized and read out.

The reliability of a depth of cover measurement is increased further, if, according to an improved coil arrangement of the invention, a second plane arranged higher is provide for the parallel coils. In this case, it is expedient for improving the depth of cover measurement to offset the measuring signals of the upper and lower coil planes ratiometrically, because interference functions in a similar way on both planes because of objects located in the vicinity and can be eliminated by forming a ratio, thereby improving the measurement.

Even the use of other combinations not dealt with here in more detail, e.g., "energize $B_L$ and read out $B_U$" or "energize $B_U$ and read out $B_L$" is conceivable. In fact the signal signatures may strongly resemble one another; but since we are dealing with independent measurements, even in the case of an almost identical signal signature, a noise reduction and thus a more reliable measurement is possible (even if it is to a lesser degree as compared with other combinations).

Figure 9:
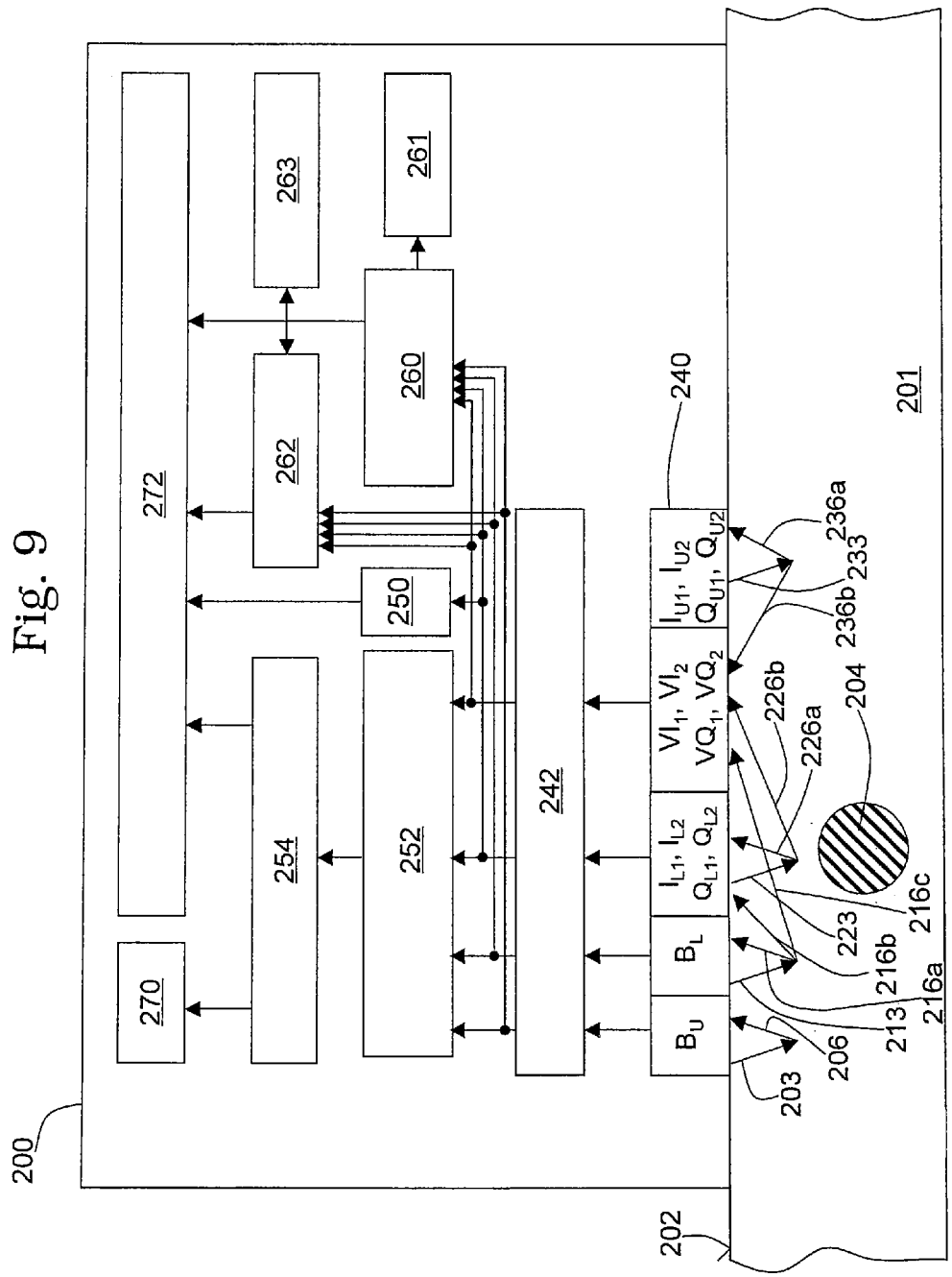
FIG. 9 is a schematic block diagram of a sensor with four pairs of parallel coils distributed to two planes in accordance with a further embodiment of the invention.

In the exemplary embodiment depicted in FIG. 9, the coil arrangement in FIG. 8 is expanded by a second plane of parallel coils. In this case, IL1, IL2 and QL1, QL2 designate the lower parallel coil pairs and IU1, IU2 and QU1, QU2 designate the upper parallel coil pairs. The upper parallel coil pairs are operated monostatically. Like all other signals, their signals are conveyed to a signal conditioner 242, and the corresponding output signals are transmitted to the depth of cover estimator 262. The signals of the upper parallel coil pairs and the signals of the lower parallel coil pairs are expressed as a ratio so that interference that has a similar effect on both planes is reduced.

The following four sequences are preferred for precise depth of cover estimating. To begin with, the first main coil $B_L$ is energized and read out together with the orthogonal coils. Then the lower parallel coils are energized and the lower parallel coils and the orthogonal coils are read out. After that the second main coil $B_U$ is energized and read out. Finally, the upper parallel coils are energized and read out together with the orthogonal coils. The further mode of operation was already discussed in the explanation of FIG. 8.

Table 1 provides an overview of the described coil operating modes.

TABLE 1

| Measurement Operating Mode | Coil Operating Modes (Energizing ⇒ Reading Out) |
|---|---|
| Depth mode of localization | First main coil ($B_L$) ⇒ First main coil ($B_L$) First main coil ($B_L$) ⇒ Parallel coil pairs (I1I2, Q1Q2) |
| Precision mode of localization | First main coil ($B_L$) ⇒ First main coil ($B_L$) First main coil ($B_L$) ⇒ Orthogonal coils (VI1, VI2, VQ1, VQ2) |
| Grate mode of localization | First main coil ($B_L$) ⇒ First main coil ($B_L$) Parallel coil pairs (I1I2, Q1Q2) ⇒ Parallel coil pairs (I1I2, Q1Q2) |
| Detecting welded grates | First main coil ($B_L$) ⇒ First main coil ($B_L$) Parallel coil pairs (I1I2, Q1Q2) ⇒ Parallel coil pairs (I1I2, QlQ2) |
| Detecting permeable subgrades | First main coil ($B_L$) ⇒ First main coil ($B_L$) Parallel coil pairs (I1I2, Q1Q2) ⇒ Parallel coil pairs (I1I2, Q1Q2) |
| Detecting orientation | Parallel coil pairs (I1I2, Q1Q2) ⇒ Parallel coil pairs (I1I2, QlQ2) |
| Estimating depth of cover | First main coil ($B_L$) ⇒ First main coil ($B_L$) Second main coil ($B_U$) ⇒ Second main coil ($B_U$) Parallel coil pairs (I1I2, Q1Q2) ⇒ Parallel coil pairs (I1I2, QlQ2) First main coil ($B_L$) ⇒ Orthogonal coils (VI1, VI2, VQ1, VQ2) |

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A coil arrangement for a magnetic sensor for detecting metallic objects in a subgrade medium, comprising:
    a first main coil, having a winding plane to a magnetomotive force that is aligned in a vertical direction relative to a movement surface of the magnetic sensor over the subgrade medium that is largely parallel to the movement surface of the magnetic sensor;
    at least two coils of a first coil group arranged in an interior of an expanded winding cylinder of the first main coil between an upper edge and a lower edge of a coil body of the first main coil; and
    at least two coils of a second coil group arranged in the interior of the expanded winding cylinder of the first main coil, wherein the at least two coils of the second coil group have a different alignment of a winding plane as compared to a winding plane of the at least two coils of the first coil group.

2. The coil arrangement according to claim 1, wherein the at least two coils of the first coil group are spaced apart equally from a main axis of the first main coil.

3. The coil arrangement according to claim 1, wherein the at least two coils of the second coil group are spaced apart equally from a main axis of the first main coil.

4. The coil arrangement according to claim 1, wherein the winding plane of the at least two coils of the second coil group is aligned perpendicular to the winding plane of the at least two coils of the first coil group.

5. The coil arrangement according to claim 1, wherein the winding plane of the at least two coils of the first coil group is aligned parallel to the winding plane of the first main coil.

6. The coil arrangement according to claim 1, wherein the winding plane of the at least two coils of the second coil group is aligned perpendicular to the winding plane of the first main coil.

7. The coil arrangement according to claim 1, wherein the first main coil is a rotationally symmetrical flat coil.

8. The coil arrangement according to claim 1, wherein the first coil group includes four coils of a same size, which are arranged at a respective angular distance of 90° and equally spaced apart from a main axis of the first main coil.

9. The coil arrangement according to claim 8, wherein the four coils of the first coil group have winding planes which are parallel to the winding plane of the first main coil.

10. The coil arrangement according to claim 9, wherein two of the four coils of the first coil group are arranged respectively into coil pairs opposite from one another and connected electrically in such a way that magnetic fields of the two coil pairs flow through a metallic object laterally in two directions that are orthogonal to each other.

11. The coil arrangement according to claim 9, wherein the four coils of the first coil group are wound ovally with respective opposing pairs having a same alignment of an auxiliary axis of a coil oval.

12. The coil arrangement according to claim 1, wherein the second coil group includes four coils of a same size, which are situated in relation to one another at a same distance from a main axis of the first main coil.

13. The coil arrangement according to claim 12, wherein winding planes of the four coils of the second coil group are each perpendicular to the winding plane of the first main coil.

14. The coil arrangement according to claim 13, wherein the four coils of the second coil group are arranged inside the at least two coils of the first coil group with respectively a same distance symmetrically to the main axis of the first main coil.

15. The coil arrangement according to claim 1, further comprising a second main coil having a winding plane parallel to the winding plane of the first main coil and wherein the second main coil is arranged above the first main coil relative to the movement surface.

16. The coil arrangement according to claim 1, wherein several of the coil arrangements are arranged in an in-line arrangement.

17. The coil arrangement according to claim 1, wherein several, respectively grouped-alike coils of the first and/or second coil groups are arranged in an in-line arrangement, wherein the first main coil surrounds the in-line arrangement.

18. The coil arrangement according to claim 15, wherein a diameter of the second main coil is smaller or larger than a diameter of the first main coil.

19. A method for operating a coil arrangement, wherein the coil arrangement includes:

a first main coil, having a winding plane to a magnetomotive force that is aligned in a vertical direction relative to a movement surface of the magnetic sensor over the subgrade medium that is largely parallel to the movement surface of the magnetic sensor;

a second main coil having a winding plane parallel to the winding plane of the first main coil, and wherein the second main coil is arranged above the first main coil relative to the movement surface;

at least two coils of a first coil group arranged in an interior of an expanded winding cylinder of the first main coil; and at least two coils of a second coil group arranged in the interior of the expanded winding cylinder of the first main coil, wherein the at least two coils of the second coil group have a different alignment of a winding plane as compared to a winding plane of the at least two coils of the first coil group;

wherein to localize deep lying objects, the coil arrangement is operated monostatically in accordance with "energize first main coil and read out" and bistatically in accordance with "energize first main coil and read out first coil group";

wherein for detecting grates and permeable subgrades, the coil arrangement is operated monostatically in accordance with "energize first main coil and read out" and monostatically in accordance with "energize first coil group and read out first coil group";

wherein for localizing lattice bars, the first coil group is operated monostatically in accordance with "energize first coil group and read out first coil group";

wherein for precisely localizing metallic objects, the coil arrangement is operated bistatically in accordance with "energize first main coil and read out second coil group";

wherein for a first depth of cover measurement of metallic objects, the coil arrangement is operated monostatically in accordance with "energize first main coil and read out" and monostatically in accordance with "energize second main coil and read out" and the two measuring results are analyzed ratiometrically;

wherein for a second depth of cover measurement of metallic objects, the coil arrangement is operated monostatically in accordance with "energize first main coil and read out" and bistatically in accordance with "energize first main coil and read out second coil group";

wherein for a third depth of cover measurement of metallic objects, the first coil group is operated monostatically in accordance with "energize first coil group and read out first coil group";

wherein for a fourth depth of cover measurement of metallic objects, the coil arrangement is operated bistatically in accordance with "energize first coil group and read out second coil group";

wherein the first coil group includes at least two coil pairs and for an orientation measurement of metallic objects, the first coil group is operated bistatically in an alternating manner, with energizing of one of the coil pairs and detection via one other of the coil pairs or vice versa;

wherein a first monostatic operation of the first coil group includes simultaneously energizing and reading out the coils of the first coil group;

and wherein a second monostatic operation of the first coil group includes sequentially energizing and reading out the two coil pairs.

* * * * *